United States Patent [19]
Burstein et al.

[11] Patent Number: 5,847,586
[45] Date of Patent: Dec. 8, 1998

[54] ENHANCED POWER-ON-RESET/LOW VOLTAGE DETECTION CIRCUIT

[76] Inventors: Steven Burstein, 121 Lone Oak Path, Smithtown, N.Y. 11787; Sharif M. Ibrahim, 22 Colby Dr., Kings Park, N.Y. 11754

[21] Appl. No.: 741,741

[22] Filed: Oct. 31, 1996

Related U.S. Application Data

[63] Continuation-in-part of Ser. No. 555,369, Nov. 8, 1995, Pat. No. 5,744,990.

[51] Int. Cl.⁶ .................................................. H03K 17/22
[52] U.S. Cl. .......................................... 327/143; 327/198
[58] Field of Search ..................... 327/143, 198, 327/72, 78, 142, 53, 66, 404, 427, 437, 545, 546, 379

[56] References Cited

U.S. PATENT DOCUMENTS

| | | | |
|---|---|---|---|
| 5,130,569 | 7/1992 | Glica | 327/143 |
| 5,164,613 | 11/1992 | Mumper | 327/143 |
| 5,396,115 | 3/1995 | Coffman et al. | 327/143 |
| 5,467,039 | 11/1995 | Bae | 327/143 |

*Primary Examiner*—My-Trang Nu Ton
*Attorney, Agent, or Firm*—Proskauer Rose LLP

[57] ABSTRACT

A comprehensive power-on-reset (POR) and low voltage detection circuit combines a Power Supply Voltage Level Detection (PSVLD) circuit with an Enhanced Retriggering (ER) circuit. The PSVLD circuit establishes lower and upper thresholds of the desired operating voltage range, and provides initial POR triggering and retriggering when the supply voltage is within the desired range. The ER circuit senses a predetermined amount of drop in the power supply voltage being monitored, and generates an independent pulse at the POR node whenever such a drop occurs. Total DC current is limited to less than 2.5 microamps, while power supply voltages can be monitored over the range of 2.5 to 5.5 volts.

A simplified POR and low voltage detection circuit establishes a single threshold and generates an initial POR signal when the supply voltage exceeds this threshold. The low voltage detection circuit causes a retrigger POR signal to be generated if the supply voltage then falls below this threshold. Total DC current is limited to less than 12 microamps, while power supply voltages can be monitored over the range of 2.5 to 5.5 volts.

6 Claims, 9 Drawing Sheets

5,847,586

ENHANCED POWER-ON-RESET/LOW VOLTAGE DETECTION CIRCUIT

This application is a continuation-in-part of U.S. Ser. No. 08/555,369, filed Nov. 8, 1995, entitled "ENHANCED POWER-ON-RESET/LOW VOLTAGE DETECTION CIRCUIT", for the same inventors Steven BURSTEIN and Sharif M. IBRAHIM now Pat. No. 5,744,990.

FIELD OF THE INVENTION

The present invention relates to a power-on-reset (POR) circuit having low DC current requirements throughout its range of operation. More specifically, the present invention relates to a tunable CMOS POR circuit with continuous power supply voltage monitoring.

BACKGROUND OF THE INVENTION

Typically, digital systems require some type of power-on-reset (POR) signal during initial turn-on. Once the power supply has stabilized within its desired operating range, a POR signal is generated to initialize various components in the system, such as flip-flops, memory devices, and clock generators. If the power supply becomes unstable and deviates from the desired operating range, a new reset signal is required to reestablish proper system operation once the power supply voltage re-enters its desired operating range. Additionally, a low voltage detector may be used to sense a predetermined drop in the power supply voltage level. In this event, a power-on-reset signal is also desirable.

To accomplish these tasks, most circuits rely on either an internally generated POR signal or an external signal. Power consumption budgets for integrated circuits used in many systems, and especially battery operated systems, are constantly decreasing, while demand for lower power versions of existing circuits is increasing. Therefore, system designers have a need for combining the desired operating features of a comprehensive power-on-reset circuit with the lowest possible power consumption. A brief analysis of the prior art is given below.

U.S. Pat. No. 4,013,902 by Payne, May 22, 1977, describes a circuit for generating an initial reset signal and for providing a low voltage detector. However, this circuit uses several external components which are not practical to manufacture as on-chip components in standard CMOS processes. There are three current paths which together continuously consume relatively large amounts of DC power while the power supply is stable. The reset pulse does not retrigger, although the circuit has a secondary output which can be used to reset circuits if necessary.

U.S. Pat. No. 4,300,065 by Remedi et al., Nov. 10, 1981, describes a CMOS power-on-reset circuit for low power supply voltages which is intended to use minimal DC power. However, this circuit requires a resistor (10) which is either external, very large in a standard CMOS process, or requires special costly manufacturing considerations. Furthermore, an inverter (19,20) operates in the linear region, consuming relatively large amounts of current. In addition, this circuit is intended for low voltage systems, and is not functional over a wide range of power supply voltages.

U.S. Pat. No. 5,111,067 by Wong et al., May 5, 1992, describes the Global Reset circuit commercialized by Intel Corporation, along with the shortfalls of that circuit. Namely, problems occur when there is a very brief interruption of the power supply voltage and the Global Reset Circuit fails to generate a new power-on-reset pulse. An important feature of this patent is an external resistor of 300k ohms, which is used to retrigger the Global Reset Circuit. DC power consumed by this resistor alone is considered unacceptable by today's standards. It is difficult to manufacture this resistor internally because it would require either a relatively large amount of silicon area or special process considerations. The Global Reset Circuit has little or no internal time constant, thus providing a relatively short reset pulse. Furthermore, the Global Reset Circuit is overly complicated, making it difficult to analyze and tune.

A power-on-reset circuit is also disclosed in Tsay et al., U.S. Pat. No. 5,159,206, Oct. 27, 1992. The circuit utilizes an on-chip voltage generator and generates a positive going pulse when an external power supply ramps up. The pulse disappears when the voltage level within the device reaches a predetermined value of the external supply voltage. The circuit includes a CMOS inverter that is biased between the external voltage and ground voltage and has its input connected to the internally regulated voltage. The gate of a pull-down transistor may couple the input of the CMOS inverter to the internally regulated voltage. A pull up transistor that is biased by the external voltage and whose gate is connected to the output of the CMOS inverter is connected to the input of the CMOS inverter.

Accordingly, it is an object of the present invention to provide a power-on-reset (POR) circuit which overcomes the prior art problems discussed above.

Specifically, it is an object of the invention in a first embodiment to provide a comprehensive (POR) circuit in which the required DC current is small.

It is also an object of the invention to provide a stable circuit which is compatible with systems using power supply levels ranging from 2.5 to 5.5 volts.

It is a further object of the invention to provide a circuit which generates a retrigger signal when the power supply voltage drops below a predetermined level.

It is yet a further object of the invention to provide a circuit which is tunable, and which sustains the output pulse for periods ranging from hundreds of nanoseconds to microseconds.

SUMMARY OF THE INVENTION

In accordance with a first embodiment of the present invention, a single POR circuit is comprised of two branches. The first branch is a Power Supply Voltage Level Detector (PSVLD) and the second branch is an Enhanced Retriggering (ER) Circuit. In the first branch, a first inverter circuit is connected to a source circuit to form a first current mirror circuit having a first threshold level in the linear operating range. A second inverter circuit is connected to a sink circuit to form a second current mirror circuit having a second threshold level in the linear operating range. The two current mirror circuits are connected in parallel between a power supply voltage to be monitored and ground, and have a common output for providing a POR signal. The POR signal is generated only when the voltage to be monitored is in the POR range; that is, between the first current mirror threshold level and the second current mirror threshold level.

In the second branch, a charge storing circuit is connected between the voltage to be monitored and ground. The charge storing circuit output is connected to a pass circuit whose output is connected to the same POR output as in the first branch. A combined bias undervoltage detection circuit is also connected between the power supply voltage and ground. This circuit is used to bias the pass circuit and cause the pass circuit to output a retrigger signal at the common POR output whenever the power supply voltage drops a predetermined amount, e.g., 40%.

The above described two branches are commonly connected between the power supply voltage to be monitored and ground, and their outputs are commonly connected to the POR node.

The inventive first embodiment described above is compatible with power supply voltages in the range of 2.5 to 5.5 volts, with a total DC current requirement of less than 2.5 microamps. The POR output signal has a duration on the order of microseconds.

It is a significant advantage of the inventive first embodiment that it is a single circuit which is highly tunable to meet a variety of individual requirements. Furthermore, no external components are required.

It is also a significant advantage of the inventive first embodiment that the retrigger signal generated by the second branch is independent of the POR signal of the first branch.

In accordance with a second embodiment of the present invention, a POR circuit is comprised of a single branch. This branch includes a Power Supply Voltage Level Detector (PSVLD) integrated with a triggering circuit. A detecting circuit is connected to a source circuit to form a current mirror circuit. The current mirror circuit establishes a desired DC trip level in a linear operating region. An inverter circuit is connected in parallel with the detecting circuit between a power supply voltage to be monitored and ground. The inverter circuit supplies a bias current for driving a POR signal into a buffered delay circuit. The buffered delay circuit determines the pulse width of the POR signal and also buffers it to multiple external logic gates.

The detecting circuit includes an inventive transistor voltage divider which controls the operation of the inverter circuit. When the power supply voltage initially rises to the DC trip level, the voltage divider output enables the inverter circuit to drive the POR signal to a logic 1, via the buffered delay circuit. Conversely, a drop in the power supply voltage below the DC trip level will drop the voltage divider output so as to cause the inverter circuit to return the POR signal to a logic 0. The voltage divider circuit can be adjusted so that the PSVLD is compatible with a desired DC trip level ranging from 2.5 to 5.5 volts.

Thus, the inventive second embodiment described above can be tuned to be compatible with power supply voltages in the range of 2.5 to 5.5 volts, with a total DC current requirement of less than 12 microamps. In this embodiment, the POR output signal has a duration on the order of hundreds of nanoseconds.

It is a significant advantage of the inventive second embodiment that it is a single circuit which is tunable to meet a variety of individual requirements. Furthermore, no external components are required.

DETAILED DESCRIPTION OF THE INVENTION

Figure 1:
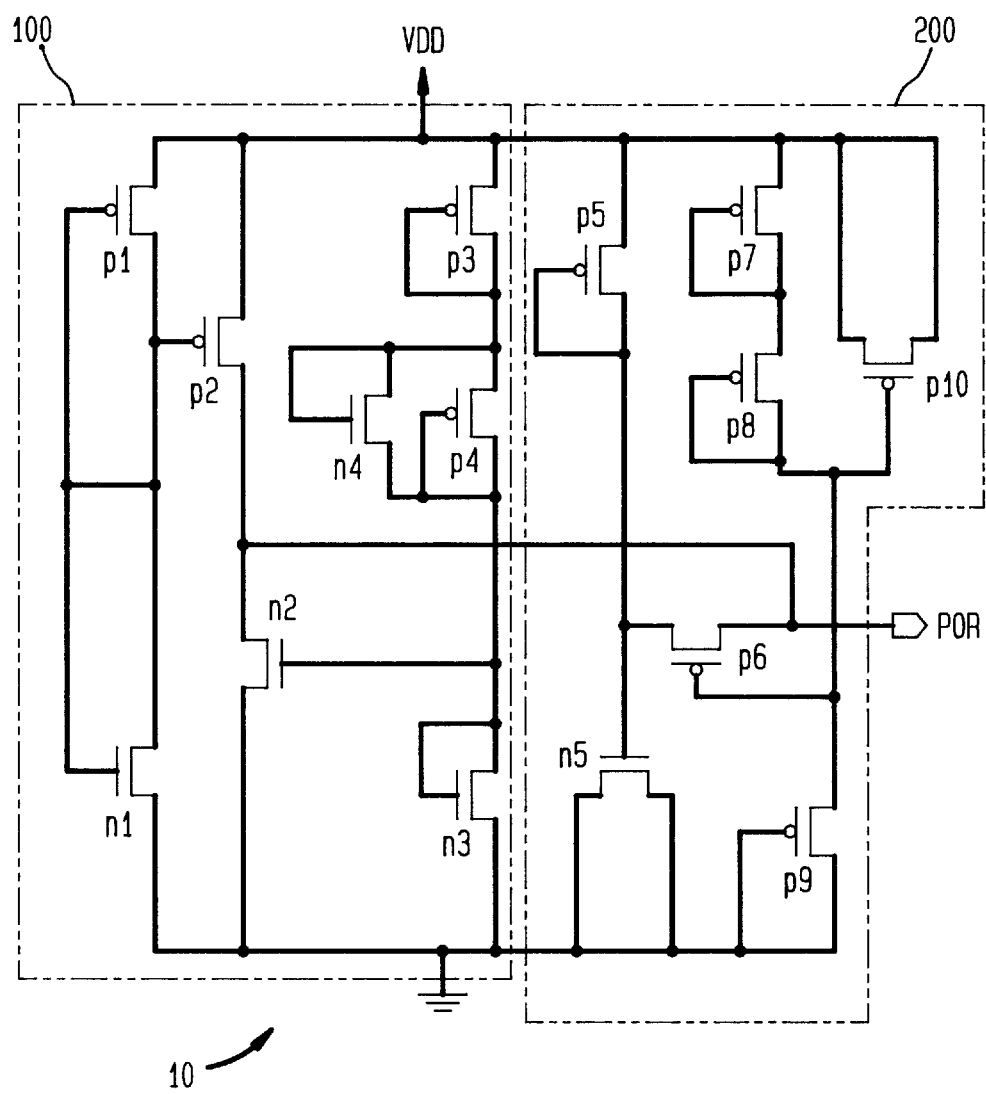
FIG. 1 schematically illustrates a POR circuit in accordance with a first embodiment of the present invention.

A POR circuit 10 in accordance with a first embodiment of the present invention is shown in FIG. 1. Circuit 10 comprises two branches, a power supply voltage level detection (PSVLD) circuit 100, and an enhanced retriggering (ER) circuit 200, as depicted by the dashed lines. As shown in FIG. 1, PSVLD 100 and ER 200 are commonly connected between the power supply voltage to be monitored (VDD) and ground. In addition, PSVLD 100 and ER 200 have their outputs commonly connected to the POR output node.

PSVLD circuit 100 is responsible for the generation of an initial reset pulse. PSVLD 100 continuously monitors the power supply voltage VDD, and generates a reset pulse at the POR output when the DC level of the power supply voltage is within the POR range (to be described below in conjunction with FIG. 2).

ER circuit 200 also generates a reset pulse at the POR output (to be described below in conjunction with FIG. 3) when the power supply voltage suddenly drops by a predetermined amount, illustratively about 40%. When the two branches (100 and 200) are combined as shown in FIG. 1, the interaction between their internal devices generates a time constant which sustains the reset pulse for a period of microseconds.

Figure 2:
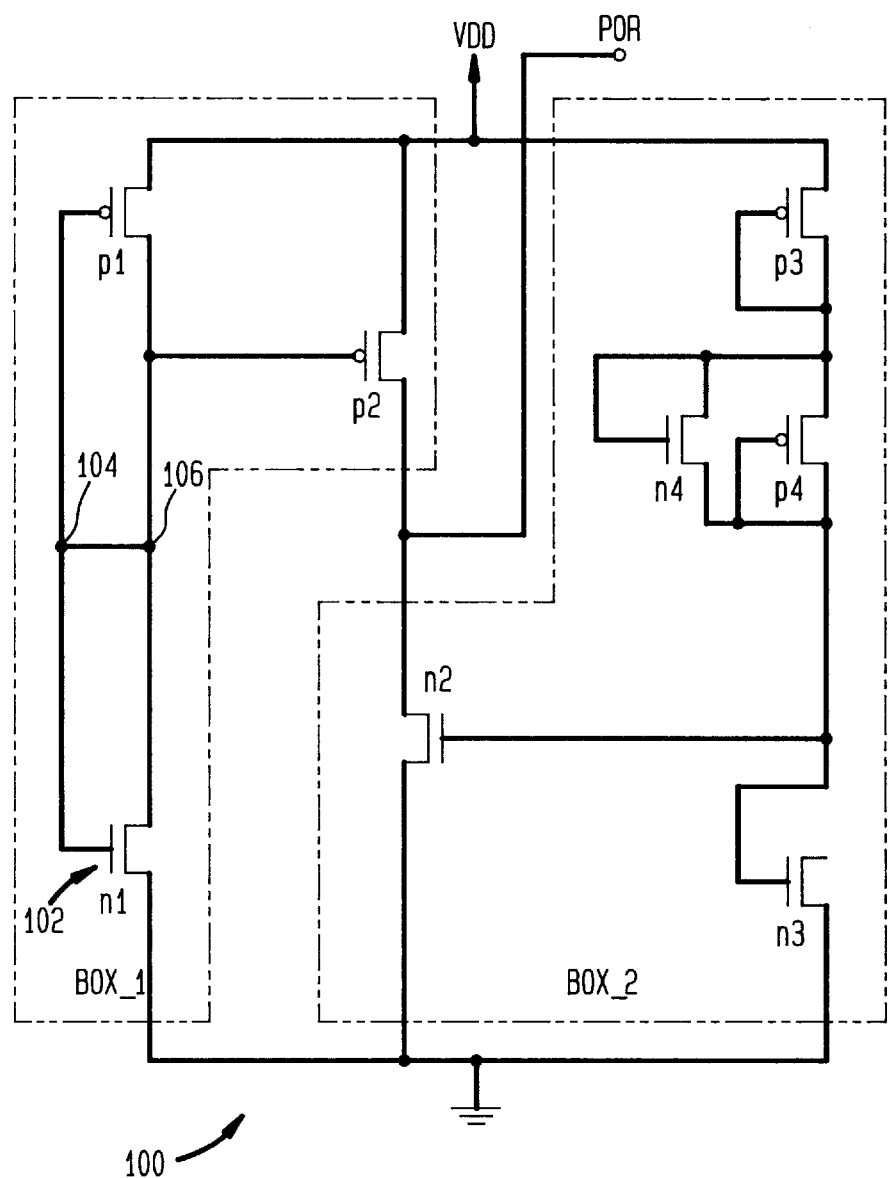
FIG. 2 schematically illustrates the first branch (PSLVD) of the POR circuit of FIG. 1.
Figure 3:
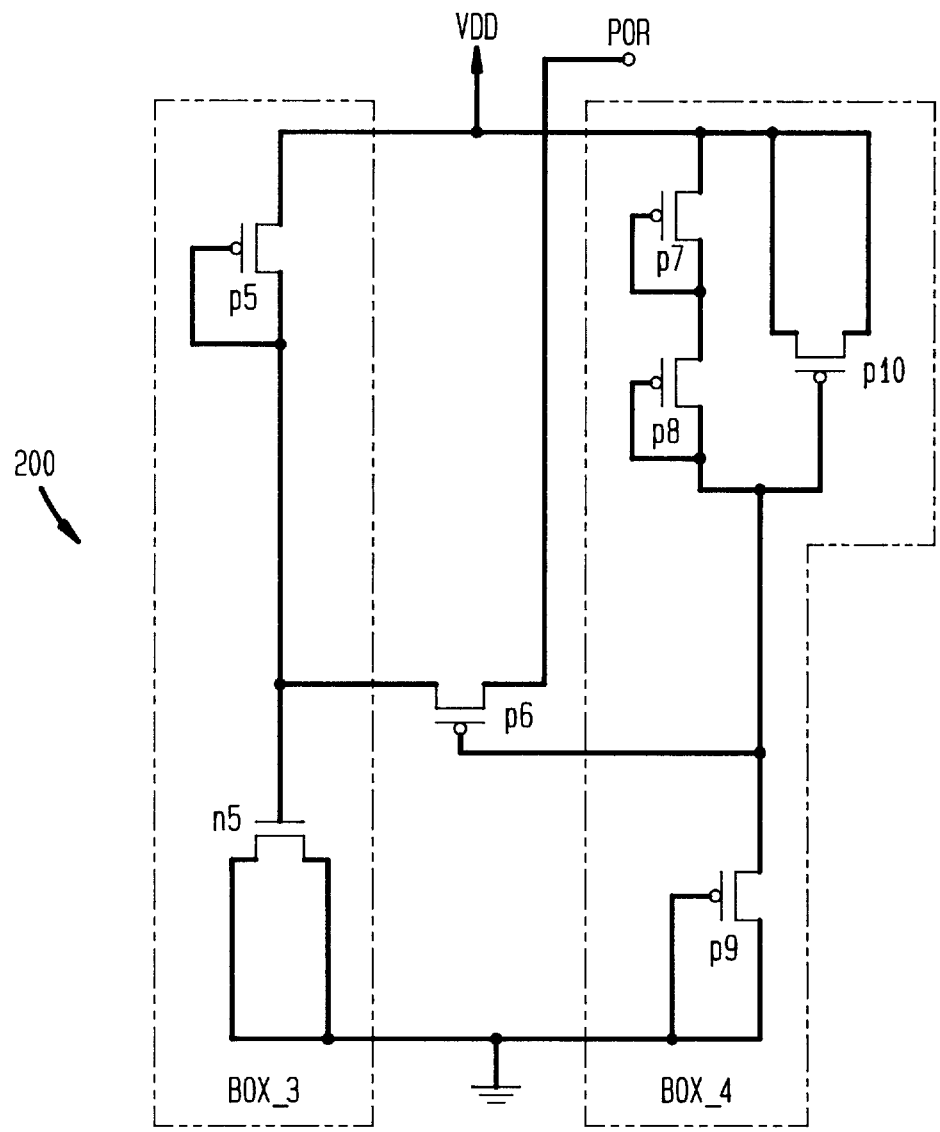
FIG. 3 schematically illustrates the second branch (ER) of the POR circuit of FIG. 1.

The reference numbers shown in FIG. 1 for the internal circuit components are carried through to FIGS. 2 and 3, which depict the details of PSVLD circuit 100 and ER circuit 200, respectively.

Turning now to FIG. 2, PSVLD circuit 100 is configured as a parallel combination of two sub-circuits (Box_1 and Box_2, respectively) connected between VDD and ground.

In Box_1, a CMOS inverter 102 with its input 104 connected to its output 106 is formed by transistors p1 and n1. Such an inverter operates in the linear region when its power supply voltage exceeds the Absolute Minimal Power Supply Voltage (AMPSV) threshold. The AMPSV threshold for a CMOS inverter is the sum of one nmos threshold and one pmos threshold, as measured with the respective source of each device connected to its substrate. CMOS inverter p1,n1 is combined with a source transistor p2 to form a current mirror, represented by Box_1. To minimize the amount of current flowing through the inverter p1,n1, transistor n1 is made particularly long, e.g. 1400 $\mu$m. Since the amount of current flowing through inverter p1,n1 is largely controlled by transistor n1, the length of transistor p1 is not critical. By making transistor p2 'x' times longer than transistor p1 and keeping the channel widths the same, the current flowing through transistor p2 will be approximately '1/x' times the amount of current flowing through transistor p1. Therefore, the variable 'x' is chosen to be reasonably large e.g. 20. If the widths of transistors p1 and p2 are chosen to be identical, the current through transistor p2 can be approximated by the following equation:

$$I_{p2}=I_{p1}*(L_{p1}/L_{p2})$$

where $I_{p2}$=current through transistor p2
$I_{p1}$=current through transistor p1
$L_{p1}$=length of transistor p1
$L_{p2}$=length of transistor p2

A second current mirror, as depicted in FIG. 2 by Box_2, is formed by transistors p3, p4, n3, n4, and n2. In this case, transistor p3 is made particularly long (e.g. 200 μm) in order to control the amount of current flow through its branch. When the widths of transistors n3 and n2 are kept equal, the ratio of lengths between transistors n3 and n2 will control the ratio of currents flowing through the transistors n3 and n2. The length of transistor n3 is made to be larger than that of transistor n2 (e.g. 40 μm for n3 and 8 μm for n2) in order to magnify the sinking power of transistor n2. If the widths of transistors n2 and n3 are identical, the current through n2 is approximated by the following equation:

$$I_{n2}=I_{n3}*(L_{n3}/L_{n2})$$

where $I_{n2}$=current through transistor n2
$I_{n3}$=current through transistor n3
$L_{n3}$=length of transistor n3
$L_{n2}$=length of transistor n2

Furthermore, the current mirror of Box_2 requires the power supply to be one threshold higher than that of the current mirror of Box_1. This three threshold drop requirement reduces the amount of current flow through the branch and allows the current limiting transistor p3 to be considerably shorter than transistor n1, which serves an identical function for the current mirror of Box_1. The added threshold drop, implemented by transistors n4 and p4, is the minimum of an nmos and pmos threshold. By making transistor p4 much shorter than transistor n4, the combination minimizes the effect of process variations.

Under typical conditions, the pmos device overpowers its nmos counterpart. The situation is the same for the fast-fast and slow-slow process corners. When nmos devices are fast, and pmos devices are slow, however, both devices possess comparable strength. In such a case, the two devices share the work load. In the final case of slow-fast, transistor p4 overpowers transistor n4 with slightly more authority than the typical fast-fast and slow-slow parameters. The range of operational variation between parameters can be altered by adjustments to the sizes of transistors n4 and p4. In the illustrated first embodiment, favorable operating characteristics were achieved across process and temperature variations.

The current mirror of Box_2 is designed to be activated when the power supply reaches the three threshold level. Upon activation, the sinking power of transistor n2 will overwhelm the sourcing power of transistor p2. Yet, the total current consumed by PSVLD 100 will be relatively small. During normal operation, output node POR maintains a logic one value as long as power supply voltage VDD is between the minimal two threshold and maximal three threshold levels (previously denoted as the POR range). At a small voltage above this range, output node POR maintains the value of a logic zero. The aforementioned POR range may be tuned by adjusting the devices in the current mirrors of Box_1 and Box_2. In this manner, the desired valid DC power supply voltage value may be attained. In the illustrated first embodiment, a single tuned circuit is compatible with supply voltages ranging from 2.5 to 5.5 volts.

The current mirror of Box_2 could be further modified to turn on at 4 thresholds by adding another set of parallel transistors (such as n4,p4) in series, which would increase the POR range described above. Illustratively, this addition could be controlled by either hardware or software by adding a controlled shunting device that would select 3 or 4 thresholds. Such a software tuning feature could be used to optimize the circuit for a particular battery voltage. In fact, under microprocessor control, the circuit could be used to sense the voltage of a charged battery and then set to detect when the voltage drops one or two thresholds.

Referring now to FIG. 3, ER circuit 200 is configured as a parallel combination of two sub-circuits (Box_3 and Box_4, respectively) connected between VDD and ground. A pass transistor p6 is connected between the two sub-circuits, with its output commonly connected to the same POR node as shown in FIG. 2.

In Box_3, transistors p5 and n5 form a charge storing circuit. When the power supply voltage VDD exceeds one pmos threshold, as determined by transistor p5, charge begins to be stored on the gate of transistor n5, which is a capacitor implemented by a transistor. When the power supply voltage is stable, voltage on the gate of transistor n5 is one pmos threshold below the supply voltage. This stored charge is accessible to pass transistor p6, which is designed to be moderate in strength, so that the current flowing through it does not dissipate via transistor n2 of PSVLD circuit 100, in FIG. 2.

Referring now to Box_4 of FIG. 3, transistors p7, p8, p9, and p10 form a bias circuit integrated with a power supply voltage drop detector. The bias circuit, comprised of transistors p7, p8, and p9, maintains the gate of transistor p6 at two pmos thresholds below the power supply voltage VDD. Under these conditions, pass transistor p6 is just barely on. If power supply voltage VDD should suddenly drop, illustratively, by approximately 40% of its full value, transistor p10 capacitively couples charge onto the gate of pass transistor p6. Transistor p6 now turns on more strongly, passing charge stored on the gate of transistor n5 to the POR node, which enables a new POR pulse, independent of the POR range described above in connection with the PSVLD circuit of FIG. 2.

The size of transistor p10 can be adjusted to vary the high frequency power supply noise rejection characteristics of ER circuit 200. Moreover, transistor p10 could be divided into several smaller devices which could be switched in and out of the circuit under either software or hardware control, for the purpose of fine tuning ER circuit 200 as needed for power supply noise rejection.

In the above described first embodiment, the minimal current sourced by the transistors driving the POR output, and the high inherent capacitance on the POR node, combine to achieve a time constant on the order of microseconds without any additional circuitry. Moreover, a buffer could be placed at the POR node to increase the time constant further, and produce a clean pulse capable of driving various required devices.

Figure 4:
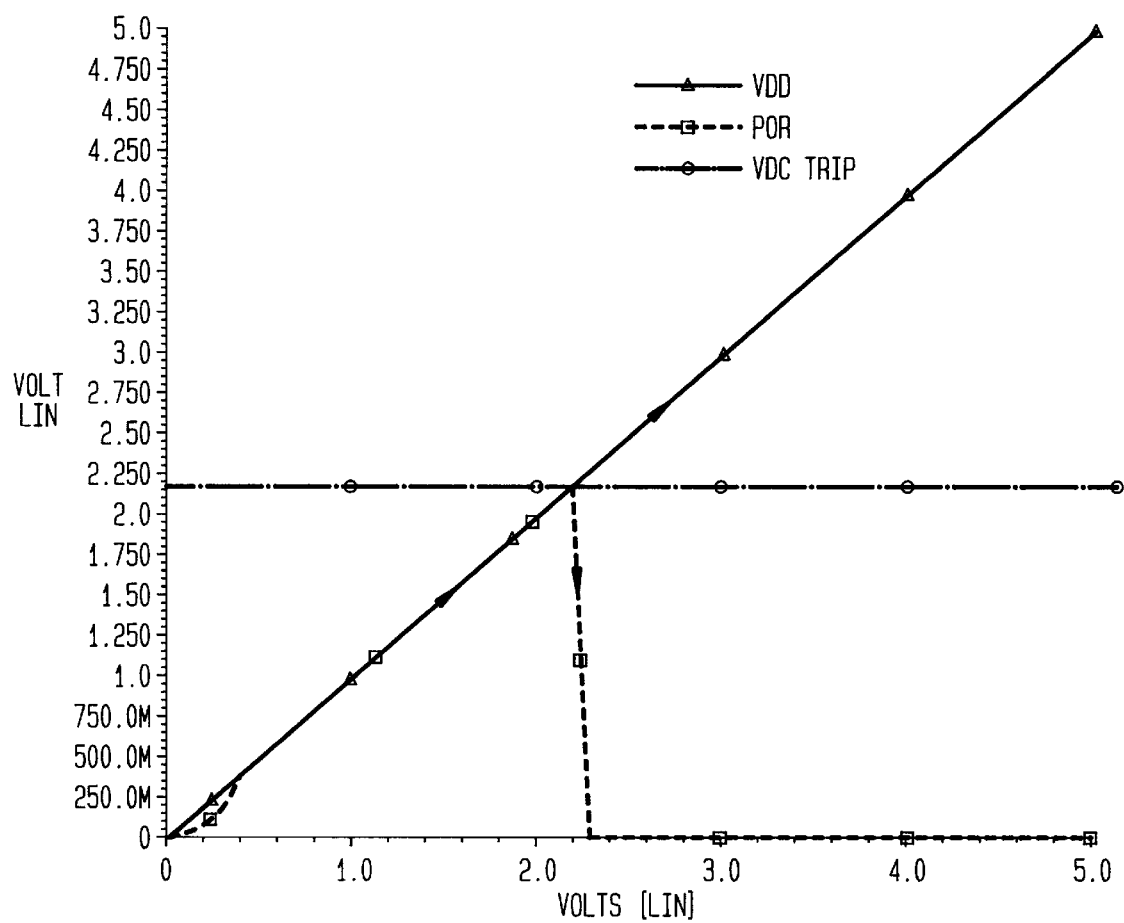
FIG. 4 graphically illustrates the operation of the inventive first embodiment under DC conditions.

FIG. 4 depicts the operation of the inventive first embodiment under DC conditions. The horizontal axis is the power supply voltage VDD. Initially, the output POR signal lags behind the power supply voltage VDD. Then, the two nodes remain identical until they reach the 2.2 volt level, identified as VDCTRIP in FIG. 4. At VDCTRIP, which is the desired valid DC power supply voltage value, the POR signal begins to decline. POR reaches its minimum value of zero volts when the power supply VDD reaches the 2.4 volt level.

Figure 5:
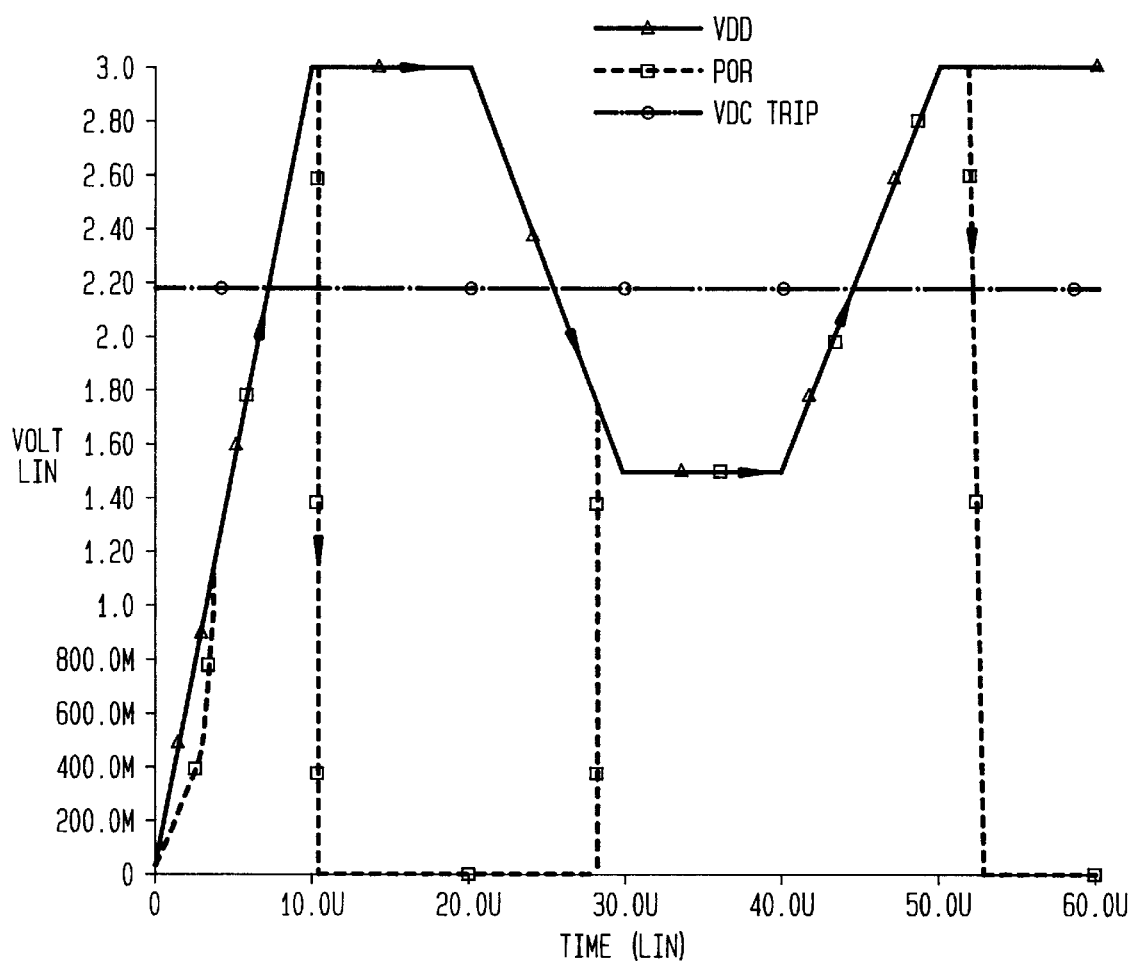
FIG. 5 graphically illustrates the operation of the inventive first embodiment for a 3 volt system under transient conditions.

FIG. 5 depicts the operation of the inventive first embodiment for a 3 volt system under transient conditions. These conditions were chosen to illustrate the features of the first embodiment. In FIG. 5, the horizontal axis is time. At the start of the cycle, power supply VDD takes 10 microseconds to migrate from its initial to its final value. When the final value is reached, VDD is sustained at that level for another 10 microseconds before proceeding on to its next transition. As shown in FIG. 5, POR lags VDD briefly, and then tracks VDD until the 3 volt level is attained. Shortly after reaching this level, POR declines abruptly. This action represents the reset pulse that is generated during an initial power-up sequence. The time taken by POR to reach the point where its decline begins, from the VDCTRIP point, represents the effect of the internal time constant. When VDD drops from the 3 volt level to approximately 1.75 volts, which is below the valid DC level (VDCTRIP), the POR signal is again activated. This pulse is also affected by the internal time constant. VDD and POR both drop to 1.5 volts, and after 10 microseconds, begin to climb back to 3 volts. Shortly after the 3 volt level is reached, the POR signal is deasserted. This occurrence represents the retriggering feature of the, inventive first embodiment. Again, this pulse is also affected by the internal time constant.

Figure 6:
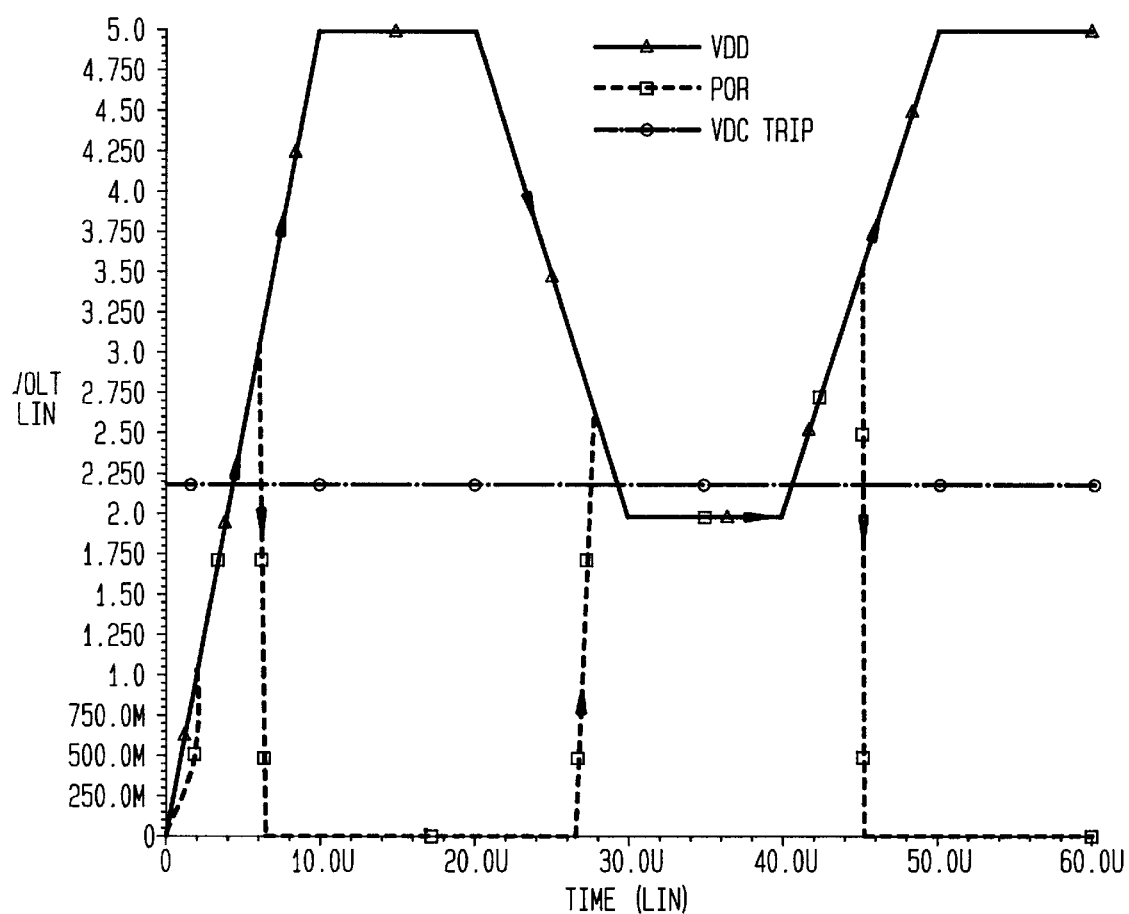
FIG. 6 graphically illustrates the operation of the inventive first embodiment for a 5 volt system under transient conditions.

FIG. 6 depicts the operation of the inventive first embodiment for a 5 volt system under transient conditions similar to those depicted in FIG. 5. In FIG. 6, VDD initially rises to a 5 volt level, rather than stopping at 3 volts. Thus, the deassertion of the reset pulse occurs while VDD is still climbing, due to the effect of the internal time constant, after VDD exceeds the VDCTRIP level. After remaining at 5 volts for 10 microseconds, VDD declines gradually to 2 volts. However, POR is activated a second time when VDD falls to an approximate value of 2.6 volts. Although this value is larger than the 2.2 volt VDCTRIP level, retriggering in this case is caused by the approximate 40% drop in VDD.

In short, a single, tunable POR circuit is disclosed as a first embodiment with comprehensive features including initial reset, retriggering, low voltage detection with independent retriggering, minimal DC current, and stable operation over a wide range of power supply voltages. Furthermore, the inventive first embodiment can be implemented in integrated circuit technologies other than CMOS. Both Bipolar and Resistor-Transistor technologies can directly model the essence of the disclosed invention by persons skilled in the respective art. For example, a Bipolar version of the present invention could be implemented by replacing nmos devices with npn transistors, and replacing pmos devices with pnp transistors. All MOS transistors implemented as capacitors could be replaced with actual capacitors. Also, NMOS device n1 could be replaced with a resistor of approximately 10 megohms. Finally, PMOS device p3 could be replaced with a combination of a pnp transistor and a resistor of approximately 2 megohms in series.

Figure 7:
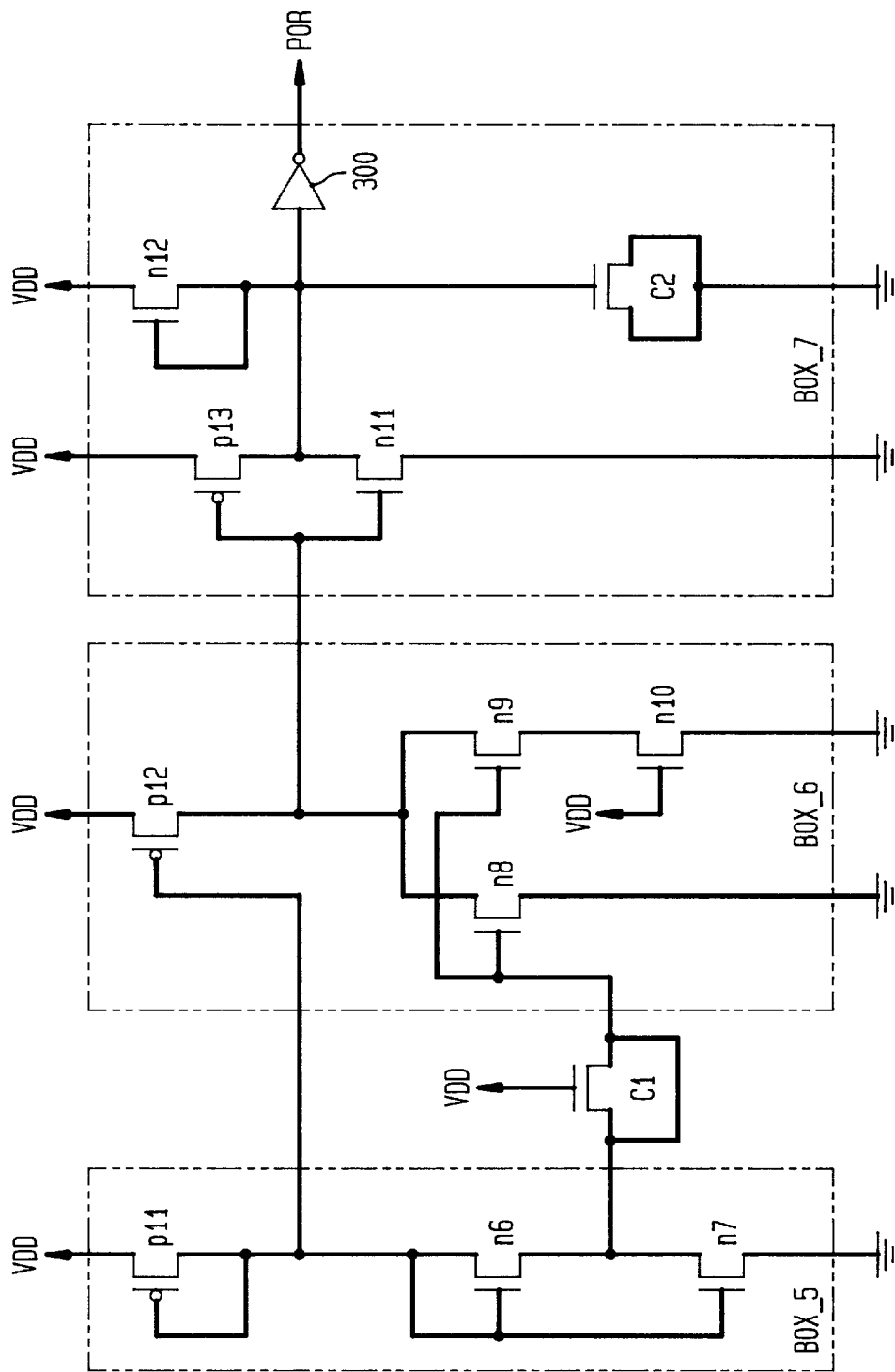
FIG. 7 schematically illustrates a POR circuit in accordance with a second embodiment of the present invention.

A second embodiment of the present invention integrates a triggering circuit with a PSVLD circuit for monitoring a power supply voltage VDD, as shown schematically in FIG. 7. In similar fashion to the first embodiment described above, a first CMOS detecting circuit operating in the linear region is formed by transistors p11, n6, and n7, as shown in sub-circuit Box_5, FIG. 7. When this detecting circuit (p11,n6,n7) is combined with transistor p12, a current mirror is formed. To minimize the amount of current flowing through the detecting circuit p11,n6,n7, transistor n7 is made relatively long, e.g. 80 $\mu$m. Since the amount of current flowing through detecting circuit p11,n6,n7 is largely controlled by transistor n7, the length of transistor p11 is not critical, e.g., 6 $\mu$m. By making transistor p12 'x' times longer than transistor p11 and keeping the channel widths the same, the current flowing through transistor p12 will be approximately '1/x' times the amount of current flowing through transistor p11. Therefore, the variable 'x' is chosen to be a factor such as 3. If the widths of transistors p11 and p12 are chosen to be identical, the current through transistor p12 can be approximated by the following equation:

$$I_{p12} = I_{p11} * (L_{p11}/L_{p12})$$

where
$I_{p12}$=current through transistor p12
$I_{p11}$=current through transistor p11
$L_{p11}$=length of transistor p11
$L_{p12}$=length of transistor p12

An inverter is formed with load transistor p12 and pull-down transistors n8, n9, and n10, as shown in sub-circuit Box_6 of FIG. 7. Transistor p12 supplies a bias current for driving the POR signal to a logic 1. Referring back to Box_5, transistors n6 and n7 form an innovative Transistor Channel Voltage Divider (TCVD), which outputs a signal via capacitor C1 to drive the gates of transistors n8 and n9. This output signal can be arbitrarily less than an NMOS threshold voltage. By adjusting the size of the two devices comprising the TCVD, the PSVLD of FIG. 7 may be tuned to a desired DC trip point ranging from 2.5 to 5.5 volts. Thus, a drop in the power supply voltage VDD below the established DC trip point will cause the output of the TCVD to drop below the NMOS threshold voltage on the gates of transistors n8 and n9.

Illustratively, transistors n8, n9, and n10 could be combined into a single device without significant deviation in the operation of the inventive second embodiment.

The inverter circuit of Box_6 outputs a POR drive signal to a buffered delay circuit, as shown in sub-circuit Box_7 of FIG. 7. The function of this delay circuit is to increase the pulse width of the POR to a desired value, e.g., several hundred nanoseconds. The delay is controlled by the high impedance of long transistor p13 (e.g., 34 $\mu$m), short transistor n11 (e.g., 1 $\mu$m), and capacitor C2. Transistor n12 is connected as a diode to help discharge C2 and retrigger a POR signal in the event of a sudden drop in the power supply voltage VDD. An inverting buffer 300 outputs the POR signal to a desired fan-out of external logic gates.

Figure 8:
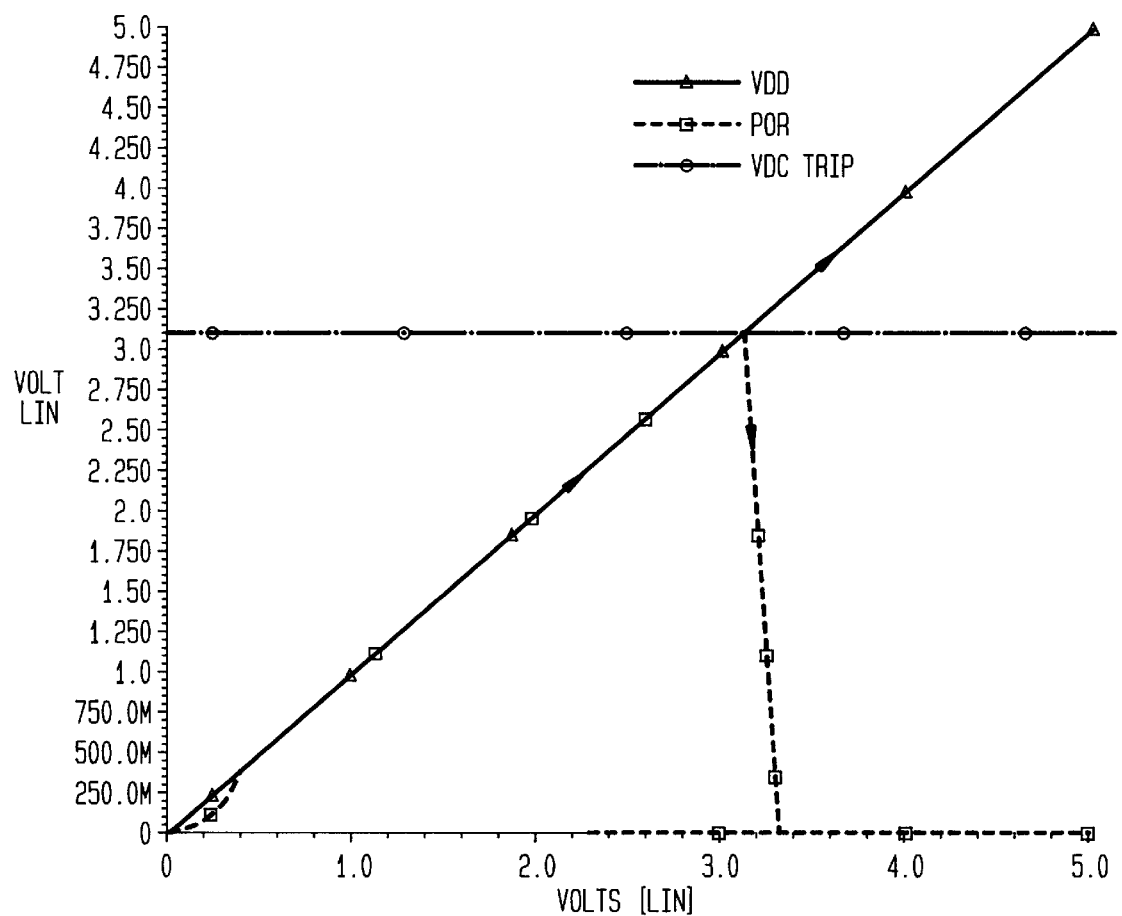
FIG. 8 graphically illustrates the operation of the inventive second embodiment under DC conditions.

FIG. 8 depicts the operation of the inventive second embodiment under DC conditions. The horizontal axis is the power supply voltage VDD. Initially, the output POR signal lags behind the power supply voltage VDD. At approximately 0.5 volt, the two nodes remain identical until they reach the 3.2 volt level, identified as VDCTRIP in FIG. 8. At VDCTRIP, which is the desired valid DC power supply voltage value, the POR signal begins to decline. POR reaches its minimum value of zero volts when the power supply VDD reaches the 3.4 volt level.

Figure 9:
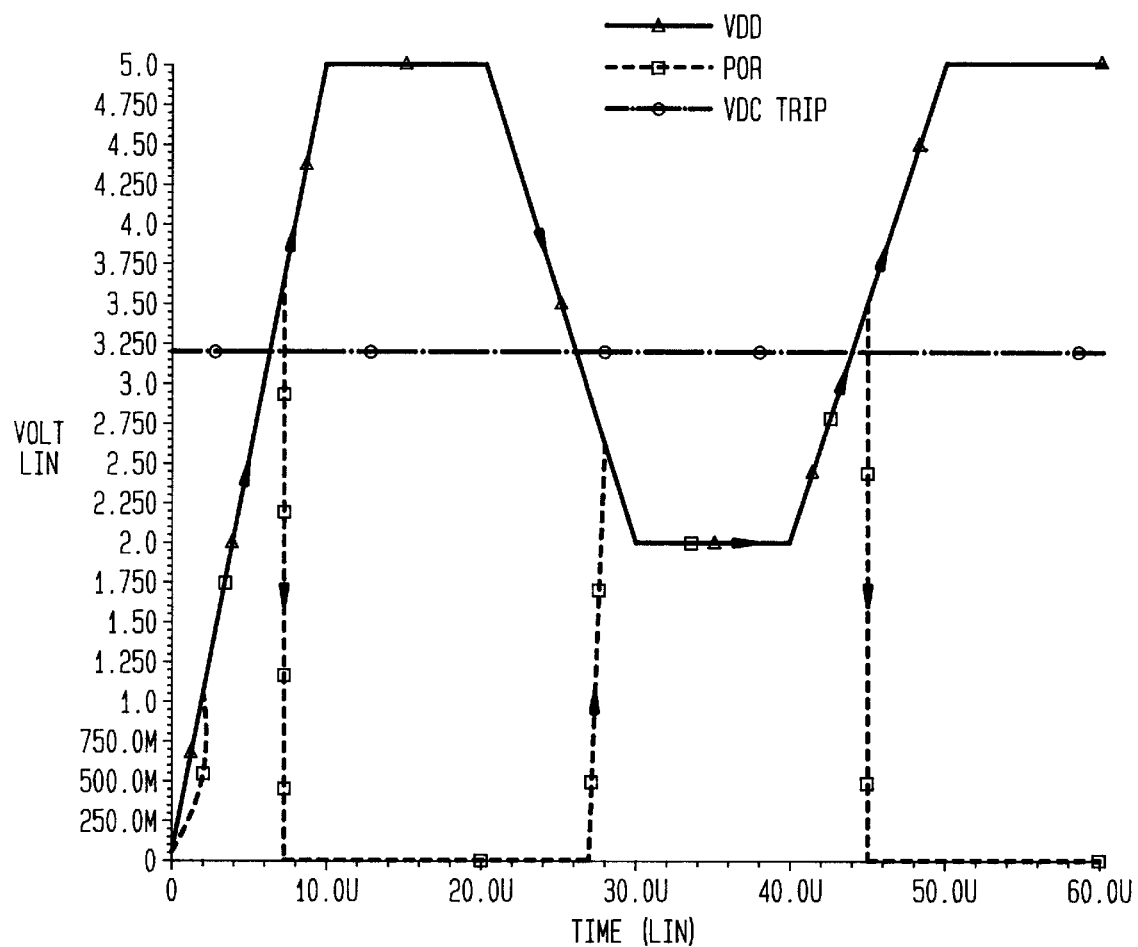
FIG. 9 graphically illustrates the operation of the inventive second embodiment for a 5 volt system under transient conditions.

FIG. 9 depicts the operation of the inventive second embodiment for a 5 volt system under transient conditions. The initial reset pulse, retriggering, and time constant features are illustrated. In FIG. 9, the horizontal axis is time. In this instance, the power supply voltage VDD monotonically increases to a 5 volt level. Deassertion of the reset pulse occurs at approximately 3.5 volts while the power supply voltage is still climbing. This action represents the reset pulse that is generated during an initial power-up sequence. The time taken by POR to reach the point where its decline begins, from the VDCTRIP point, represents the effect of the internal time constant. This is the only controlling factor when the POR signal is deasserted above the VDCTRIP point. When VDD drops from the 5 volt level to approximately 2.6 volts, which is below the VDCTRIP point, the POR signal is again activated (i.e., retriggers). This pulse is also affected by the internal time constant. The intrinsic delays of the circuit account for the apparent hysteresis in this transient analysis, as depicted in FIG. 9.

The above described embodiments of the invention are intended to be illustrative only. Numerous alternative embodiments may be devised by those skilled in the art without departing from the spirit and scope of the following claims.

We claim:

1. A power-on-reset circuit comprising:

a detecting circuit comprising a transistor with its control electrode connected to its output and in series with a transistor voltage divider circuit, an inverter circuit comprising a load transistor connected in series with a transistor pulldown circuit, a buffered delay circuit comprised of a high impedance transistor circuit connected to a capacitor to form a time delay circuit, a transistor diode connected to said capacitor for rapidly discharging said capacitor, and an inverting buffer connected to said capacitor for outputting a signal across said capacitor to external gates, said detecting circuit being connected to said load transistor of said inverter circuit so as to comprise a current mirror circuit having a linear operation threshold level, said transistor voltage divider circuit in said detecting circuit being coupled to said transistor pulldown circuit in said inverter circuit so as to control a cut-off threshold of said transistor pulldown circuit, said detecting circuit, said inverter circuit, and said buffered delay circuit being commonly connected between a power supply voltage to be monitored and a reference voltage, wherein said inverter circuit generates an initial power-or-reset signal when said power supply voltage to be monitored exceeds said linear operation threshold level, wherein said inverter circuit retriggers said initial power-on-reset signal when said power supply voltage to be monitored drops below said linear operation threshold level, wherein said buffered delay circuit receives said initial power-on-reset signal from said inverter circuit and widens an output signal to a desired value, and wherein said buffered delay circuit outputs said widened signal from said inverting buffer.

2. The power-on-reset circuit of claim 1 wherein said power supply voltage to be monitored ranges from 2.5 to 5.5 volts.

3. The power-on-reset circuit of claim 1 wherein said linear operation threshold level is adjustable.

4. The power-on-reset circuit of claim 1 wherein said power-on-reset circuit is implemented in CMOS logic.

5. The power-on-reset circuit of claim 1 wherein said power-on-reset circuit is implemented in Bipolar logic.

6. The power-on-reset circuit of claim 1 wherein said power-on-reset circuit is implemented in Resistor-Transistor logic.

* * * * *